United States Patent [19]

Shiratake et al.

[11] Patent Number: 5,293,508
[45] Date of Patent: Mar. 8, 1994

[54] ION IMPLANTER AND CONTROLLING METHOD THEREFOR

[75] Inventors: Shigeru Shiratake; Hirohisa Yamamoto, both of Itami, Japan

[73] Assignee: Mitsubishi Denki Kabushiki Kaisha, Tokyo, Japan

[21] Appl. No.: 865,275

[22] Filed: Apr. 8, 1992

[30] Foreign Application Priority Data

Oct. 16, 1991 [JP] Japan .................. 3-267650

[51] Int. Cl.$^5$ ........................... H01J 37/317
[52] U.S. Cl. ................... 250/492.21; 250/251; 250/398
[58] Field of Search ............. 250/492.21, 492.2, 398, 250/251

[56] References Cited

FOREIGN PATENT DOCUMENTS 0104818  9/1983  European Pat. Off.
59-81852 5/1984  Japan .
2-247970 10/1990 Japan ................ 250/492.2

*Primary Examiner*—Jack I. Berman
*Attorney, Agent, or Firm*—Leydig, Voit & Mayer

[57] ABSTRACT

An ion implanter encloses a semiconductor substrate adjacent to a fixing member which retains a semiconductor substrate on a supporting bed. The ion implanter includes a ring electrode for generating secondary electrons in response to incident ions and a cup-like electrode for directing the secondary ions to the semiconductor substrate. The ring electrode is negatively biased with respect to the supporting bed and the cup-like electrode surrounds the outer edge of the semiconductor substrate. The ion implanter increases the quantity of the secondary electrons produced and efficiently directs them to the semiconductor substrate. The semiconductor substrate which is electrically charged by implanting ions is neutralized, preventing dielectric breakdown from occurring in an insulating film.

9 Claims, 7 Drawing Sheets

ION IMPLANTER AND CONTROLLING METHOD THEREFOR

BACKGROUND OF THE INVENTION

1. Field of the Invention

The present invention relates to an ion implanter and a controlling method therefor. More particularly, it pertains to an ion implanter used to form a dopant impurity layer in a semiconductor substrate during the a manufacturing process and to a method of controlling such an ion implanter.

2. Description of the Related Art

An ion implanting method is used as one of the methods of forming dopant layers in a semiconductor substrate. FIG. 6 is a schematic view showing a conventional ion implanter. Such an ion implanter is used to implant ions into a semiconductor substrate in the following way.

First, a dopant gas or vapor from a solid is fed to an ion source 1, where an arc discharge occurs to generate a high-density plasma. Then, a high voltage (generally, 20-80 kV) is applied to an extraction electrode (not shown) to extract ions from the ion source 1. At the same time, a predetermined energy is given to the ions to convert them into ion beams 2. The ions are deflected by a mass analyzer 3. The ions each have a predetermined electrical charge and mass determined by the magnetic flux density, energy, and the curvature radius of the mass analyzer 3. Such ions are selected from the ion beams 2, to which the predetermined energy has been given.

Then, the ion beams 2 pass through a resolving aperture 4 to improve the resolution of the ion beams, and are led to an acceleration tube 5 where the energy of the ion beams is increased to a predetermined level. A quadrupole lens 6 is adjusted so that the ion beams 2 are focused on a semiconductor substrate 7, the target, disposed in an implant chamber 10. At this phase, scanning electrodes 8 and 9 scan the ion beams 2 so that ions are implanted uniformly into the semiconductor substrate 7.

The conventional ion implanter is constructed as described above. In most cases, when ion implantation is carried out, patterns are already formed on the semiconductor substrate 7. FIG. 7 shows an example of a semiconductor substrate 7 on which patterns are already formed. As shown in FIG. 7, the semiconductor substrate 7 is of a p-type. Thick field oxide insulating films 12 are disposed selectively on the obverse surface of the semiconductor substrate 7. Thin insulating films 13, acting as gate insulating films, are formed in active regions sandwiched by the field oxide insulating films 12. Gate electrodes 14 are disposed on the insulating films 13. As semiconductor devices become smaller and smaller, insulating films 13 become thinner and thinner.

When a CMOS transistor is formed, as shown in FIG. 7, a photoresist 15 usually masks a p-channel region 11. In such a case, ion implantation is performed to make the source and drain of an n-channel region N type. At this time, ions (positive ions) made of a dopant element, such as phosphorus or arsenic, are used to form ion beams 12.

When the ions are implanted in the semiconductor substrate 7 coated with the insulating films 12 and 13, and the photoresist 15, the obverse surface of the semiconductor substrate 7 becomes positively charged. As a result, there is great possibility that a dielectric breakdown will occur in the extremely thin insulating films 13.

A charge neutralizer 16 is generally used as a means of preventing such a dielectric breakdown. FIG. 8 is a view illustrating the operation of the charge neutralizer 16. As shown in FIG. 8, the charge neutralizer 16 accelerates primary electrons 17 emitted from a filament 16b of an electron gun 16a. This acceleration takes place in an electric field of approximately 300 V. The emitted primary electrons 17 then irradiate a Faraday cage opposite to the charge neutralizer 16 in order to generate secondary electrons 19. The secondary electrons 19 are supplied to the semiconductor substrate 7 into which ions are being implanted. The semiconductor substrate 7 which has been electrically charged by the positive ions is thereby neutralized electrically. The semiconductor substrate 7 is secured by a clamping ring 20 to a supporting bed 21.

When such a charge neutralizer 16 is used in ion implantation, portions of the primary electrons 17 recoil and reach the semiconductor substrate 7 while they possess an energy of approximately 300 eV. The recoil electrons exceed the positive potential of the semiconductor substrate 7, which has become positively charged with the ion beam 2, and reach an electrically neutral portion of the semiconductor substrate 7, which in turn becomes negatively charged. In other words, the ion beams 2 move on the semiconductor substrate 7 so as to scan it. For this reason, when a charge is observed at an extremely small region of the semiconductor substrate 7, it is found that the substrate 7 is positively and negatively repeatedly.

In this way, when the charge neutralizer 16 is used in ion implantation, the semiconductor substrate 7 is positively and negatively charged repeatedly, and will not be neutralized. As a result, there is a great possibility that a dielectric breakdown will occur in the extremely thin insulating film 13. Such a phenomenon becomes pronounced, particularly when the insulating film 13 has a large area. For instance, a MOS capacitor has a great possibility of a dielectric breakdown since the insulating film 13 must have a large area to increase its electric capacitance. In addition, the quantity of recoil electrons increases as the Faraday cage 18 becomes dirty. For example, when an impurity-doped insulating film is formed on the Faraday cage 18, the surface of the cage 18 becomes charged and the charge changes with time. Ion implantation cannot be controlled effectively.

When the ion implanter mentioned above is used to perform ion implantation, electrical charging occurs and causes a dielectric breakdown in smaller and smaller semiconductor devices. Consequently, such a breakdown decreases the yield as well as the reliability of the semiconductor devices. Even when the charge neutralizer 16 is used, primary electrons having high energy negatively charge the semiconductor substrate 7. Thus, the charge neutralizer 16 does not completely solve the problem of the conventional art. Moreover, when ion implantation is carried out so as not to cause electrical charging, it becomes time-consuming, reducing productivity.

SUMMARY OF THE INVENTION

The present invention has been made to solve the above disadvantages. Accordingly, an object of this invention is to provide an ion implanter in which ion beams are used to effectively generate low-energy secondary electrons which cause no negative charging. The secondary electrons are allowed to reach a semiconductor substrate which can be neutralized even after this substrate has become charged by implanting ions. Another object of this invention is to provide a method of controlling such an ion implanter.

In order to achieve the above objects, according to one aspect of the present invention, there is provided an ion implanter comprising an ion source; means for extracting ion from the ion source so as to form an ion beam, means for uniformly scanning the ion beam across a semiconductor substrate; an ion implant chamber for accommodating the semiconductor substrate; a supporting bed disposed in the ion implant chamber, on which the semiconductor substrate is mounted; a fixing member for retaining the semiconductor substrate on the supporting bed; secondary electron generating means, adjacent to the fixing member, which encloses the semiconductor substrate and is negatively biased with respect to the supporting bed; and secondary electron directing means for directing secondary electrons generated by the secondary electron generating means to the semiconductor substrate, the directing means enclosing an outer periphery of the semiconductor substrate.

According to another aspect of this invention, there is provided a method of controlling an ion implanter, comprising the steps of extracting ion from an ion source to form an ion beam; directing, by secondary electron directing means negatively biased with respect to a supporting bed, secondary electron generated by a secondary electron generating means to a semiconductor substrate; impinging the ion beam on the semiconductor substrate; and turning off a bias voltage when the secondary electron directing means becomes insulated during ion implantation beam.

DESCRIPTION OF THE PREFERRED EMBODIMENTS

Figure 1:
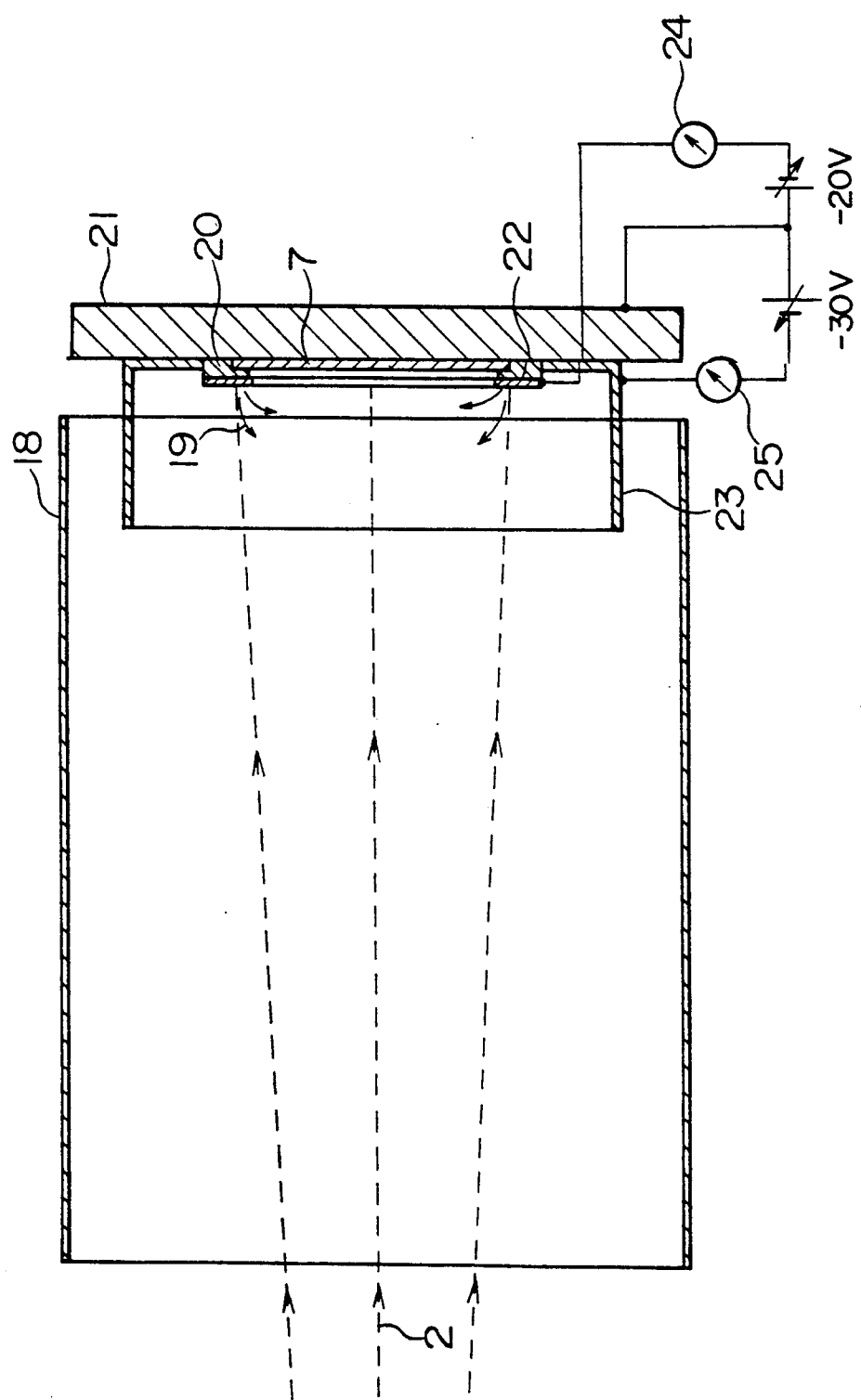
FIG. 1 is a schematic cross view showing an ion implanter in accordance with an embodiment of the present invention.

FIG. 1 is a schematic cross-sectional view showing an ion implanter in accordance with an embodiment of the present invention. Throughout the drawings, the same numerals denote identical or corresponding components. As shown in FIG. 1, a charge neutralizer 16 is not provided, and secondary electron generating means, such as a ring-like electrode 22, and secondary electron directing means, such as a cup-like electrode 23, are provided. The secondary electron generating means is used for increasing the quantity of secondary electrons inevitably generated by the ion beams 2. Electrode 28 has a wall that encloses the outer periphery of a semiconductor substrate 7 to direct the secondary electrons onto the semiconductor substrate 7. These are features of this invention and are different from the conventional ion implanter.

The thus-constructed ion implanter is the same as the conventional ion implanter, except for neutralization of the charge on the semiconductor substrate 7, and a detailed explanation of the implanter is omitted. In FIG. 1, the ring-like electrode 22 is disposed on a clamp ring 20 which holds the semiconductor substrate 7 mounted on a supporting bed 21. The electrode 22 is insulated electrically from the clamp ring 20, and is negatively biased with respect to the supporting bed 21. In FIG. 1, the electrode 22 has a surface substantially parallel to the substrate 7. Because the ring-like electrode 22 is disposed within the scanning path of the ion beams 2, it is irradiated by the ion beams 2, thus generating secondary electrons 19. At this phase, the ring-like electrode 22 increases the quantity of the secondary electrons 19 generated since it is negatively biased. The generated secondary electrons 19 are directed onto the semiconductor substrate 7 which is positively charged, thus neutralizing the positive charge of the semiconductor substrate 7. An ammeter 24 is connected to electrode 22 to measure the quantity of the secondary electrons 19 which are increased by the negative bias. The secondary electrons 19 turns the negative bias of the ring-like electrode 22 on and off, depending on the current flowing to the ring-like electrode 22.

The cup-like electrode 23, enclosing the outer periphery of the semiconductor substrate 7, is negatively biased with respect to the supporting bed 21. The cup-like electrode 23 repels the secondary electrons generated at the semiconductor substrate 7 and the ring-like electrode 22 so that the secondary electrons 19 are directed to the semiconductor substrate 7. An ammeter 25 is connected to the electrode to measure the electric current flowing to the cup-like electrode 23. An electric current flows to the ammeter 25 in the direction in which electrons usually impinge on the cup electrode 23. The amount of the electric current decreases with the aging of the surface of the cup-like electrode 23. The reduction is monitored. The bias of the cup-like electrode 23 may be turned off.

In FIG. 1, the ring-like electrode 22 is biased at −20 V, and the cup-like electrode 23 is biased at −30 V. However, it is preferable that a bias voltage ranging from −50 V to −10 V be applied to both of the electrodes 22 and 23.

Although the negatively-biased cup-like electrode 23 is formed of metal in the embodiment described above, it may also be formed of an insulating material.

Figure 2:
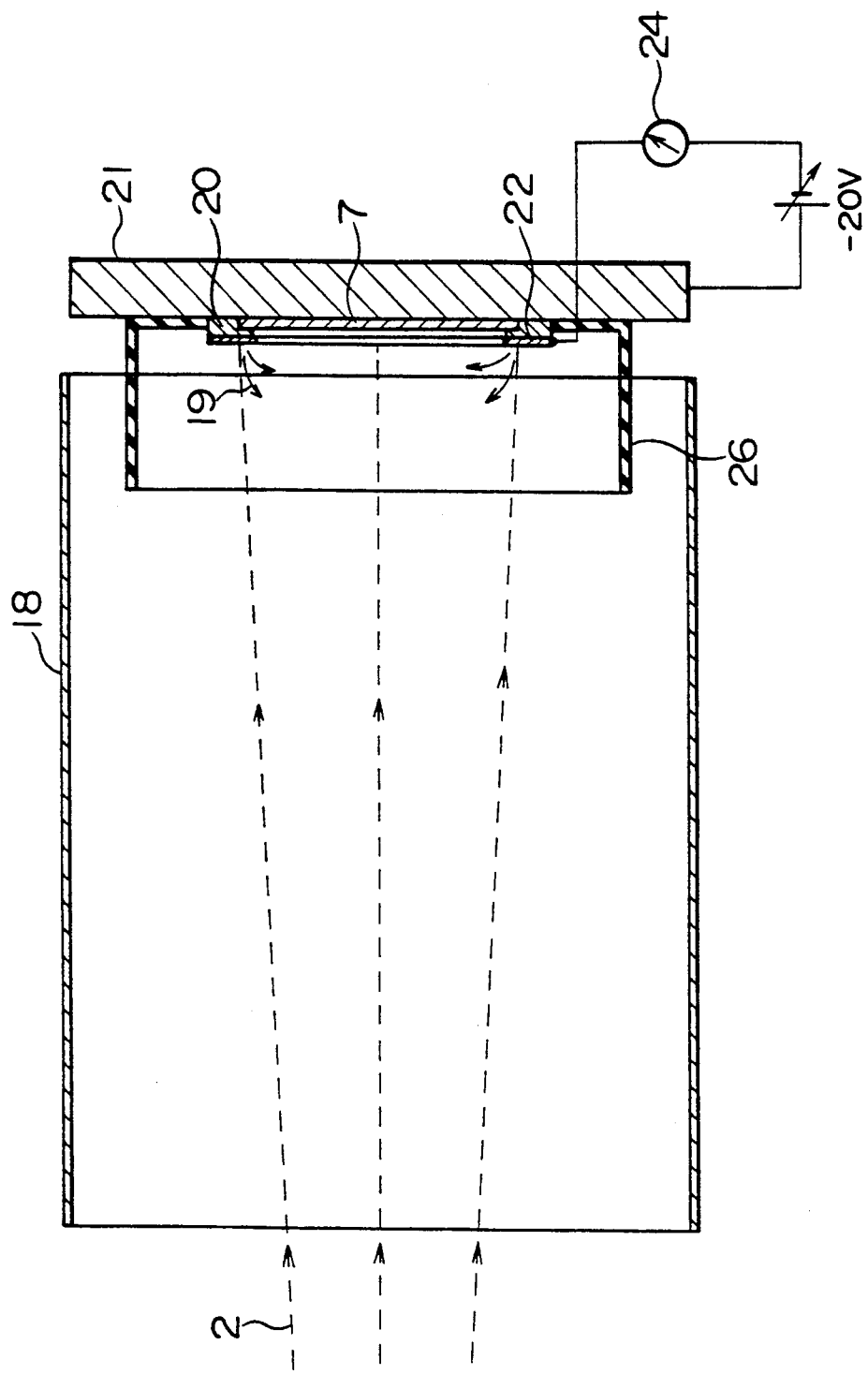
FIG. 2 is a schematic cross-sectional view showing an ion implanter in accordance with another embodiment of this invention.

FIG. 2 is a schematic cross-sectional view showing an ion implanter in accordance with another embodiment of this invention. A cup 26 formed of an insulating material is provided in the embodiment shown in FIG. 2. Secondary electrons 19 emitted from a ring-like electrode 22 negatively charge the surface of the cup 26. For this reason, the cup 26 repels the secondary electrons 19 so that they can be directed to a semiconductor substrate 7. Thus the cup 26 neutralizes the electrical charge on the semiconductor substrate 7. In this embodiment, though the cup 26 is formed of an insulating material it may also be formed of metal whose surface is coated with an insulating material. For example, the cup 26 may be formed of aluminum with an anodized oxide coating.

It is possible to control the ion implanter in the following manner. When the electrically-conductive cup-like electrode 23, shown in FIG. 1, is negatively biased, it is used to implant ions. As the ion implantation proceeds, an impurity, such as a resist, adheres to the inner walls of the cup-like electrode 23, thereby reducing its electrical conductivity. When the cup-like electrode 23 becomes insulated, which can be monitored by the ammeter 25, the source of a negatively biased current is switched off. This switching makes it possible to use the cup-like electrode 23 as the cup 26 mentioned above.

Figure 3:
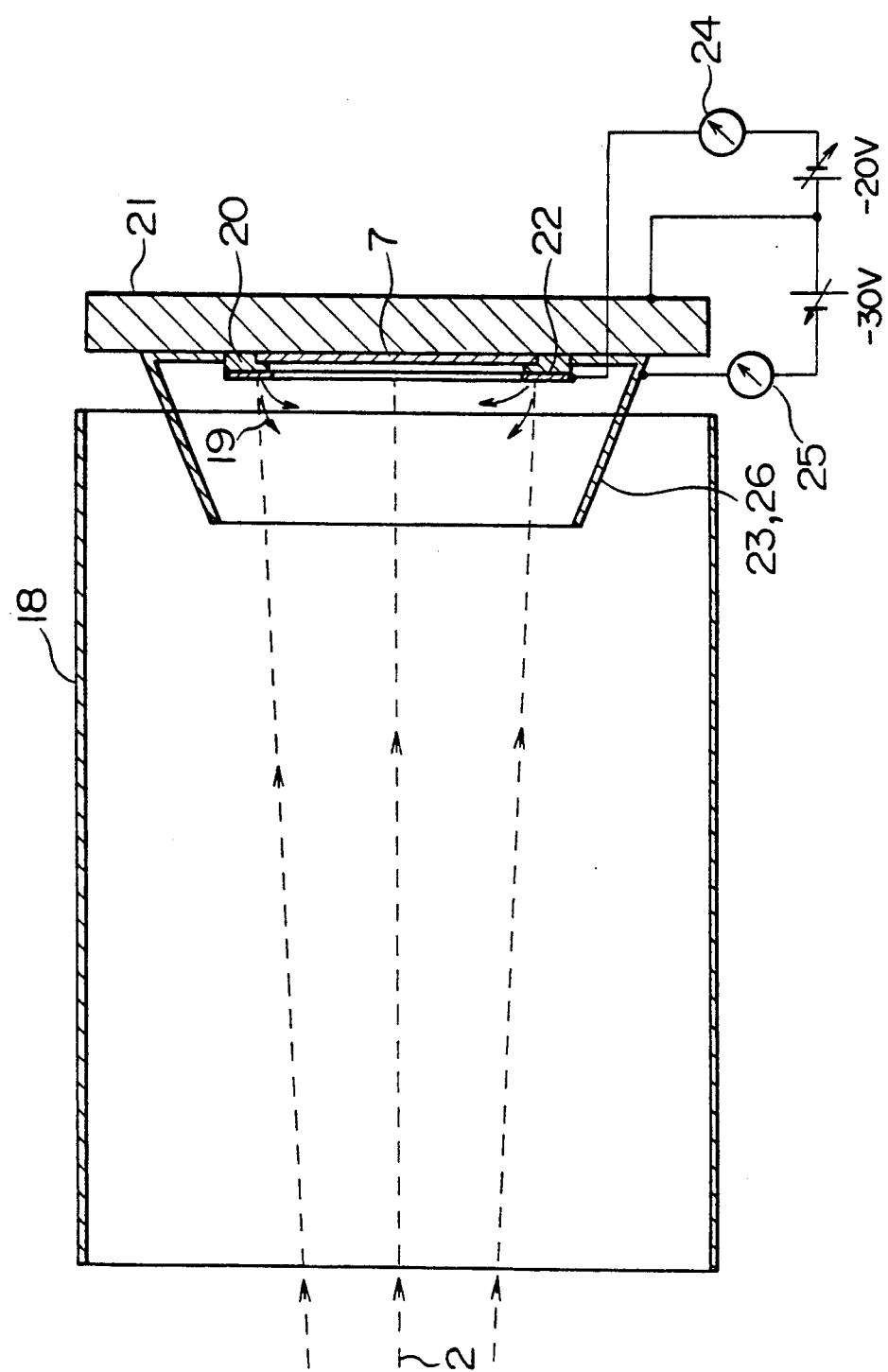
FIG. 3 is a schematic cross-sectional view showing an ion implanter in accordance with a further embodiment of this invention.

In the above embodiments, although the cup-like electrode 23 and the cup 26 each have a cylindrical configuration, as shown in FIG. 3, the opening of either component 23 or 26 may be bent inwardly so as to effectively emit secondary electrons 19. The electrode 23 and the cup 26 are not limited to specific configurations, but may take any shape. The same advantages as those described can be obtained with various configurations.

Figure 4:
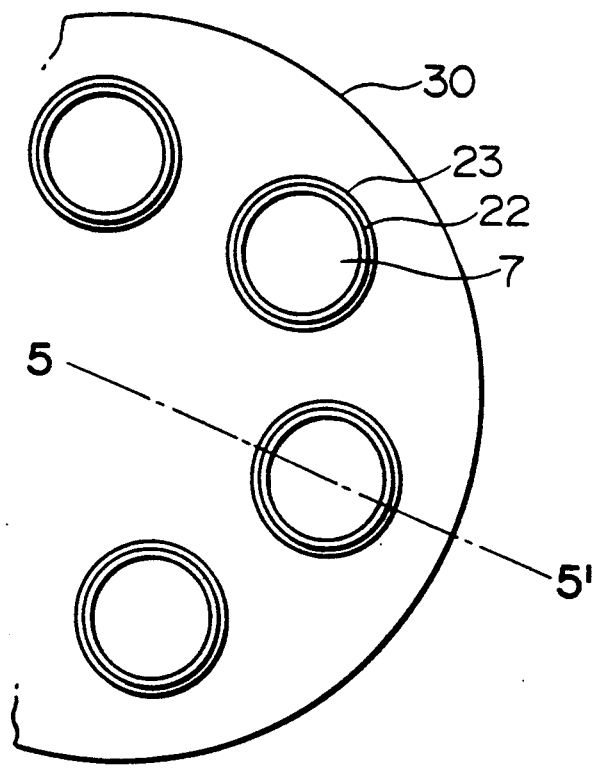
FIG. 4 is a schematic plan view showing a stage of an ion implanter in accordance with yet another embodiment of this invention.
Figure 5:
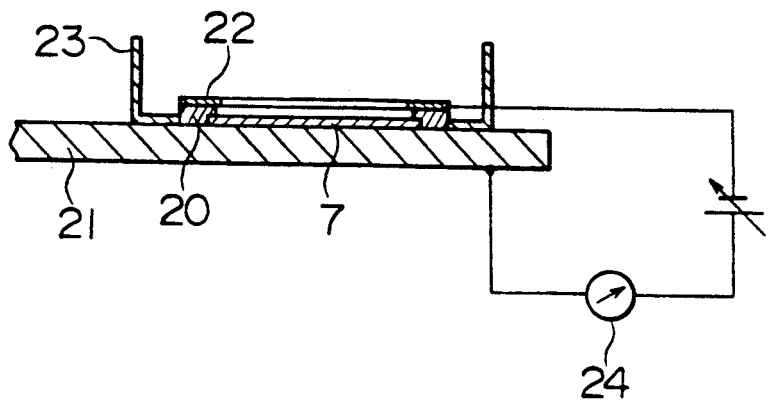
FIG. 5 is a schematic cross-sectional view taken along line 5—5 of FIG. 4.
Figure 6:
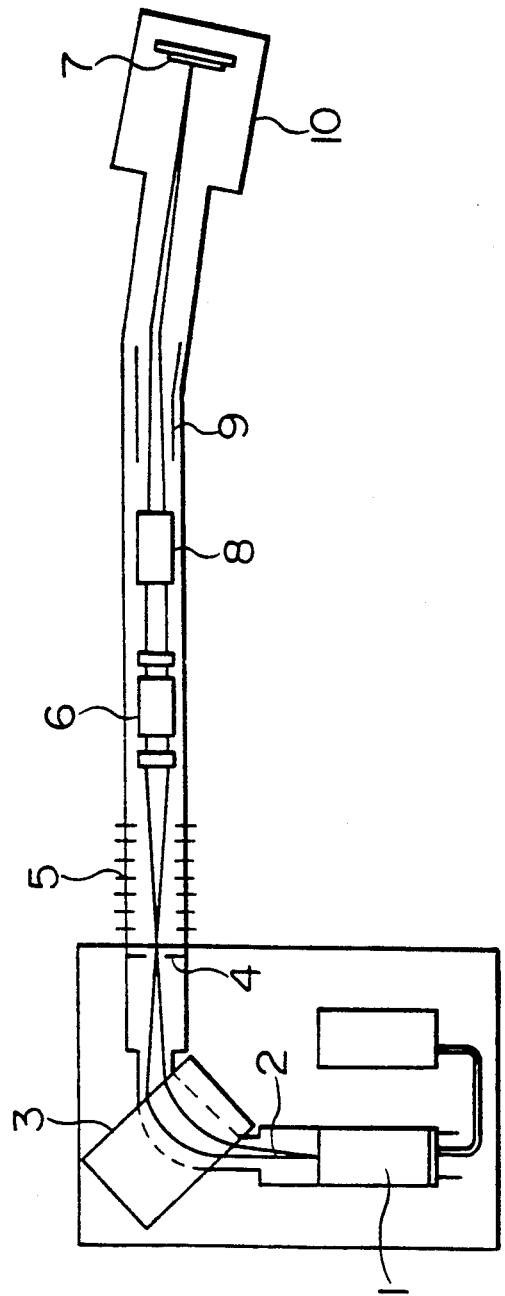
FIG. 6 is a schematic view showing the structure of the conventional ion implanter.
Figure 7:
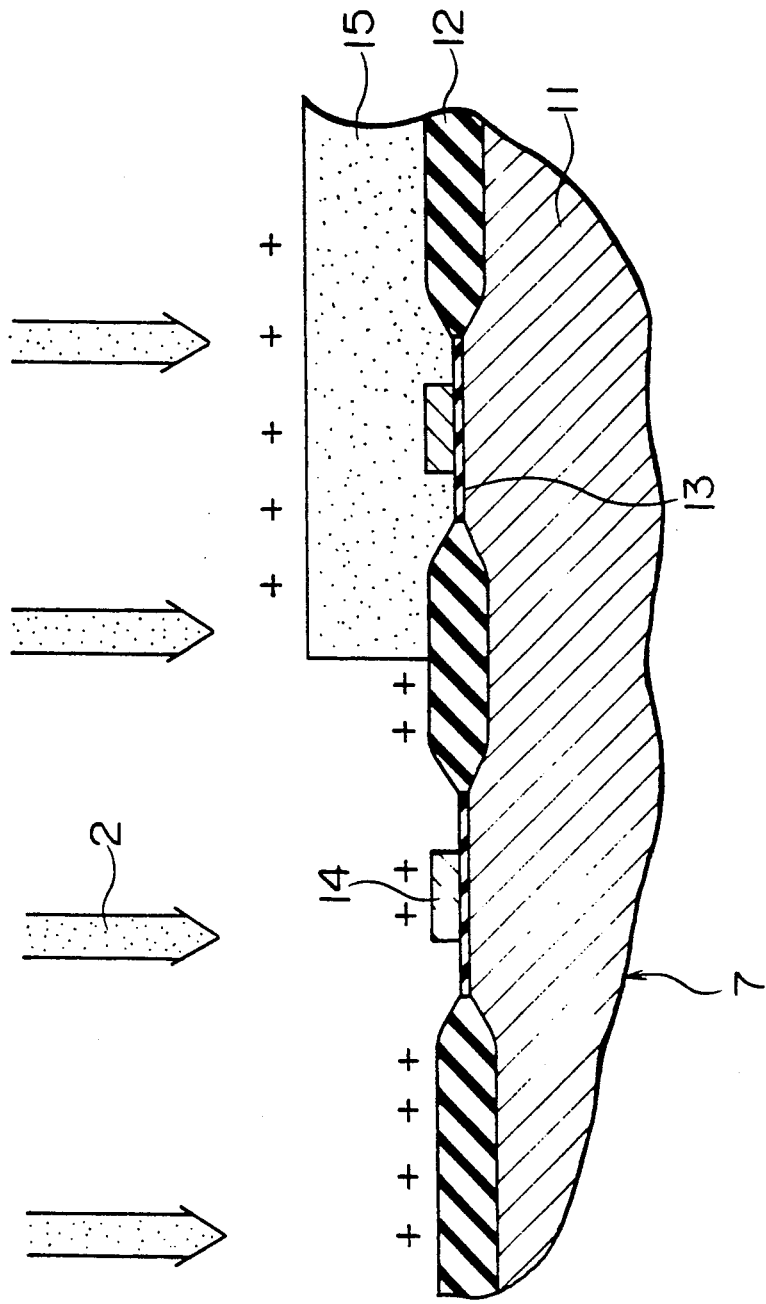
FIG. 7 is a schematic cross-sectional view showing how an insulated film formed on a semiconductor substrate is electrically charged.
Figure 8:
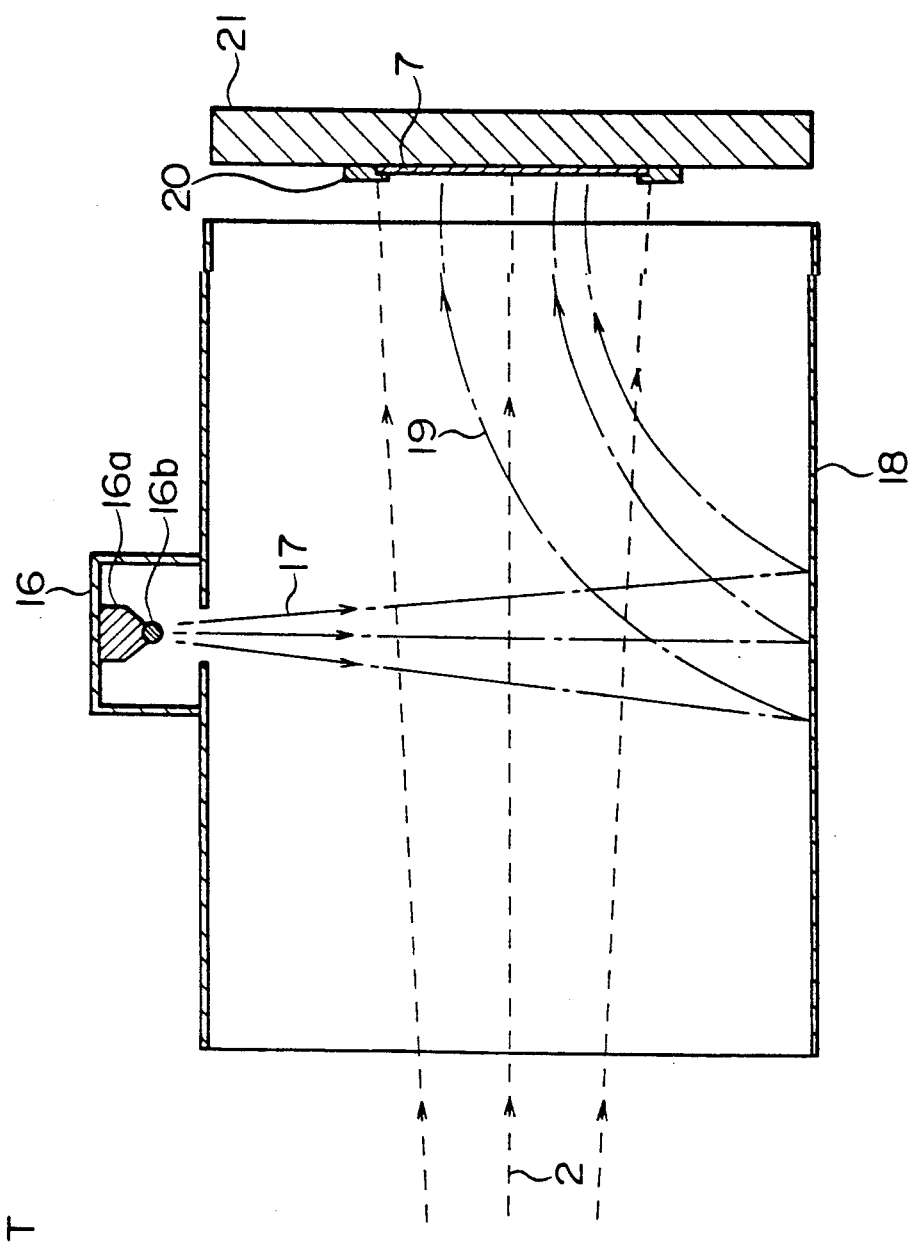
FIG. 8 is a view illustrating the operation of a charge neutralizer used in the conventional ion implanter.

The above embodiments of the present invention are applied to a so-called single wafer-type implanter in which a medium current machine, producing an ion current of not more than 1 mA, is used to implant ions into one semiconductor substrate at a time. However, as shown in FIG. 4, these embodiments may also be applied in the same manner as that described above to a batch-type ion implanter in which a large current machine is used to implant ions into a plurality of semiconductor substrates 7 mounted on a disk 30. In such a case, as shown in FIG. 5, a ring-like electrode 22 and a cup-like electrode 23 may be provided at each semiconductor substrate 7.

What is claimed is:

1. An ion implanter comprising:
an ion source;
extracting means for extracting ions from the ion source to form an ion beam;
scanning means for scanning the ion beam across a semiconductor substrate;
an ion implantation chamber for accommodating a semiconductor substrate;
a supporting bed disposed in the ion implantation chamber on which a semiconductor substrate is mounted;
a fixing member for retaining the semiconductor substrate on the supporting bed;
a first electrode disposed adjacent to the fixing member in a path of the ion beam scanned across the semiconductor substrate by the scanning means, surrounding the semiconductor substrate, and electrically insulated from the supporting bed, secondary electrons being produced in response to ions incident on the first electrode; and
a second electrode surrounding an outer periphery of the semiconductor substrate and electrically insulated from the first electrode for charging to a different electrical potential from the first electrode to direct secondary electrons generated at the first electrode toward the semiconductor substrate.

2. An ion implanter as claimed in claim 1 including a voltage source for applying a bias voltage to the first electrode from −50 to −10 V.

3. An ion implanter as claimed in claim 1 including a voltage source for applying a bias voltage to the second electrode from −50 to −10 V.

4. A method of controlling an ion implanter comprising:
extracting an ion from an ion source and forming an ion beam;
generating secondary electrons in response to ions incident on a secondary electron generating means;
directing with a negatively biased electrically conducting secondary electron directing means secondary electrons toward a semiconductor substrate;
implanting ions from the ion beam into the semiconductor substrate;
turning off the bias applied to the secondary electron directing means when the secondary electron directing means becomes electrically insulating during ion implantation with the ion beam.

5. An ion implanter comprising:
a substrate support for supporting a semiconductor substrate;
scanning means for scanning a semiconductor substrate mounted on the support with an ion beam;
an electrode surrounding a semiconductor substrate mounted on the support and having a surface disposed to be scanned by the ion beam, secondary electrons being produced in response to ions incident on the electrode;
means for maintaining the electrode at a negative electrical potential with respect to the substrate support; and
an electron directing member having an electrically insulating surface surrounding a semiconductor substrate mounted on the support and the electrode and disposed to be charged by secondary electrodes generated at the electrode.

6. An ion implanter as claimed in claim 5 wherein the electron directing member has a first portion extending generally parallel to the substrate support and a second portion extending substantially perpendicular from the substrate support.

7. An ion implanter as claimed in claim 6 wherein the second portion is cylindrical.

8. An ion implanter as claimed in claim 5 wherein the electrode is substantially parallel to the substrate.

9. An ion implanter comprising:
a substrate support for supporting a semiconductor substrate;
a ring-shaped first electrode mounted on the substrate support for surrounding a semiconductor substrate mounted on the support and having a surface substantially parallel to a semiconductor substrate mounted on the support;
a second electrode having a first portion extending generally parallel to the substrate support and a wall extending substantially perpendicular to the substrate support and surrounding a semiconductor substrate mounted on the support and the first electrode;
scanning means for scanning a semiconductor substrate mounted on the support and the first electrode with an ion beam; and
means for maintaining the first and second electrodes at different negative electrical potentials with respect to the substrate support.

* * * * *